United States Patent
Hunkeler et al.

(10) Patent No.: US 7,146,721 B2
(45) Date of Patent: Dec. 12, 2006

(54) METHOD OF MANUFACTURING A SEALED ELECTRONIC MODULE

(75) Inventors: Hugh R. Hunkeler, Kokomo, IN (US); Duane D. Fortune, Lebanon, IN (US)

(73) Assignee: Delphi Technologies, Inc., Troy, MI (US)

( * ) Notice: Subject to any disclaimer, the term of this patent is extended or adjusted under 35 U.S.C. 154(b) by 174 days.

(21) Appl. No.: 11/016,230

(22) Filed: Dec. 17, 2004

(65) Prior Publication Data

US 2005/0198819 A1    Sep. 15, 2005

Related U.S. Application Data

(63) Continuation-in-part of application No. 10/800,959, filed on Mar. 15, 2004.

(51) Int. Cl.
*H05K 3/30* (2006.01)

(52) U.S. Cl. .......................... 29/841; 29/832; 29/840; 174/521

(58) Field of Classification Search ................ 29/832, 29/840, 841; 174/521
See application file for complete search history.

(56) References Cited

U.S. PATENT DOCUMENTS

| | | | | | |
|---|---|---|---|---|---|
| 4,249,229 | A | * | 2/1981 | Hester | 361/752 |
| RE31,704 | E | * | 10/1984 | Hester | 361/752 |
| 4,871,319 | A | * | 10/1989 | Babow | 439/77 |
| 4,928,082 | A | * | 5/1990 | Yagi et al. | 338/174 |
| 5,319,522 | A | * | 6/1994 | Mehta | 361/748 |
| 5,703,754 | A |   | 12/1997 | Hinze | 361/736 |
| 5,739,463 | A | * | 4/1998 | Diaz et al. | 174/378 |

\* cited by examiner

*Primary Examiner*—Carl J. Arbes
(74) *Attorney, Agent, or Firm*—Jimmy L. Funke

(57) ABSTRACT

A circuit board is inserted into an open-ended housing and potting material is dispensed onto the exposed face of the circuit board in a single step to seal the circuit board to the housing. One or more electrical interconnects such as a connector header or a ribbon cable attached to the circuit board extend upward through the potting material so that the potting material also forms an environmental seal around the electrical interconnects.

7 Claims, 3 Drawing Sheets

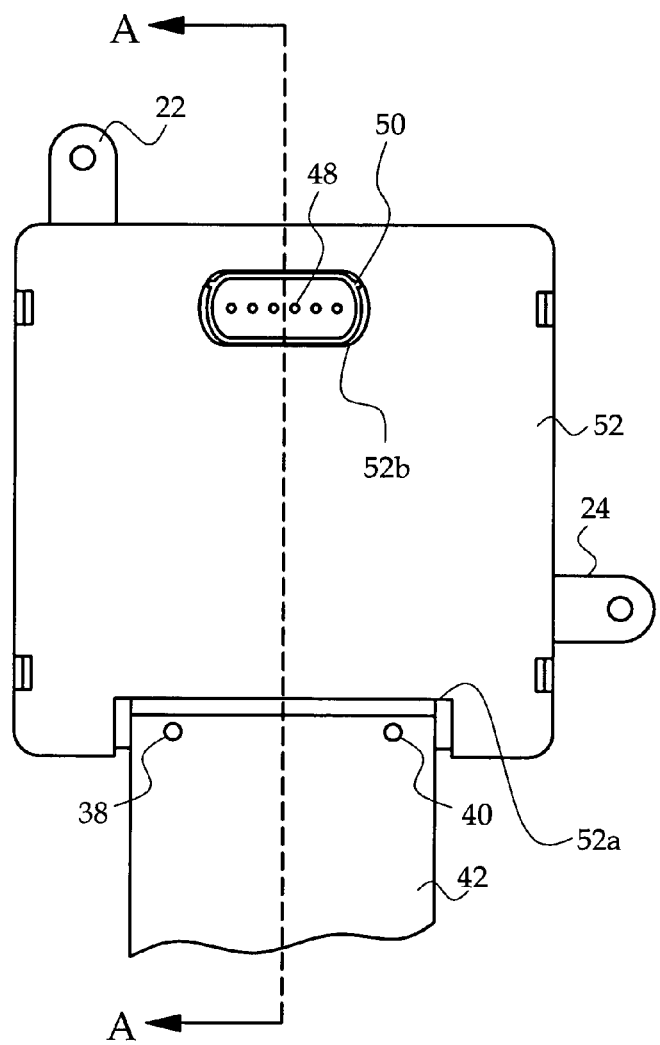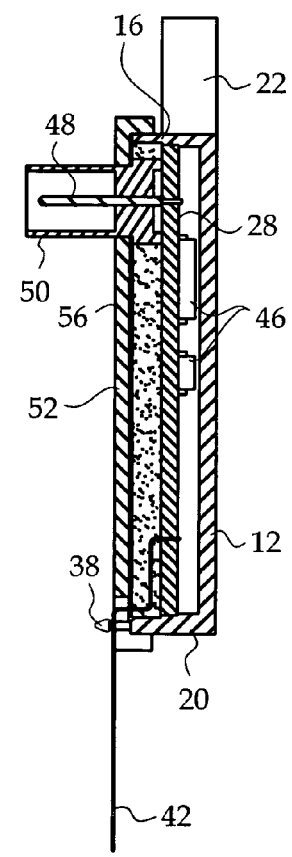
FIG. 2A
FIG. 2B

US 7,146,721 B2

METHOD OF MANUFACTURING A SEALED ELECTRONIC MODULE

RELATED APPLICATIONS

This application is a continuation-in-part of co-pending U.S. patent application Ser. No. 10/800,959, filed on Mar. 15, 2004.

TECHNICAL FIELD

The present invention relates to the manufacture of a sealed electronic module including a circuit board/connector assembly and a housing open at one end.

BACKGROUND OF THE INVENTION

In the manufacture of an electronic module, various electronic components and a header containing connector terminals are attached to a printed circuit board, and the assembly is inserted into a plastic or metal housing such that the header is aligned with a connector opening in a side-wall of the housing. The circuit board assembly may be secured to the housing with conventional fasteners or by a coating of potting material as disclosed in the U.S. Pat. No. 5,703,754 to Hinze. The approach disclosed by Hinze is particularly advantageous because the potting material environmentally seals the module in addition to obviating the use of fasteners. However, some provision must be made for sealing an external electrical connector to the housing. In Hinze, for example, the external connector must seal against a collar protruding from a sidewall of the housing. What is desired is a sealed module in which potting material is used to not only fasten and seal a circuit board in a housing, but also to environmentally seal around one or more electrical interconnects for the circuit board.

SUMMARY OF THE INVENTION

The present invention is directed to the manufacture of an electronic module including a housing that is open at one end and a circuit board fitted with one or more electrical interconnect element, where potting material dispensed in a single step environmentally seals both the circuit board and the electrical interconnect(s). The housing is positioned with its open end upward to receive the circuit board and electrical interconnect assembly. The electrical interconnect extends substantially perpendicular to the plane of the circuit board, and the circuit board is inserted into the housing so that the electrical interconnect extends out of the housing. Potting material is dispensed in a single step to cover the exposed face of the circuit board and the seal around the protruding electrical interconnect. The electrical interconnect may be a connector header or an electrical cable such as a ribbon cable.

BRIEF DESCRIPTION OF THE DRAWINGS

FIG. 1A depicts an open-ended housing; FIG. 1B depicts a circuit board with electrical interconnects inserted into the housing of FIG. 1A; FIG. 1C depicts a step of dispensing potting material onto an exposed face of the circuit board of FIG. 1B; and FIG. 1D depicts a completed electronic module according to this invention;

FIG. 2A is a top view of the completed electronic module of FIG. 1D.

FIG. 2B is a cross-sectional view of a completed electronic module of FIG. 2A, taken along lines A—A of FIG. 2A.

DESCRIPTION OF THE PREFERRED EMBODIMENT

FIGS. 1A–1D illustrate a sequence of manufacturing steps for producing a sealed electronic module according to the present invention. The manufacturing method is disclosed in the context of an automotive electronic module but applies to environmentally sealed electronic modules per se, whether automotive or non-automotive.

Figure 1A:
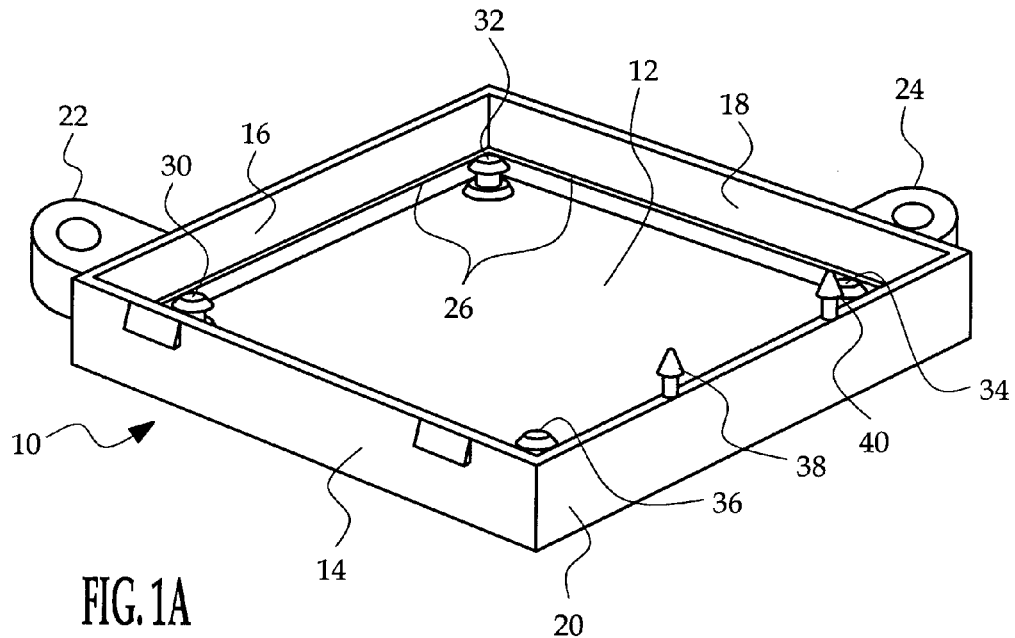
FIGS. 1A–1D illustrate the manufacturing method of this invention.
Figure 1B:
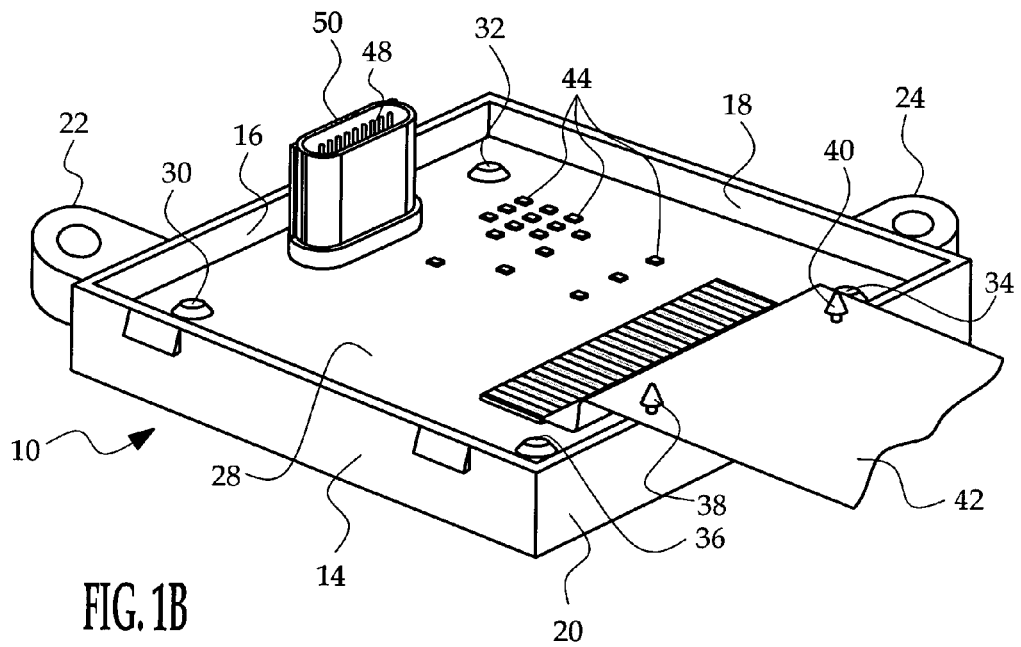

Referring to FIG. 1A, the reference numeral 10 generally designates an open-ended cast or molded housing having a bottom 12, side walls 14, 16, 18, 20 and a pair of integral mounting tabs 22, 24. The interior faces of side walls 14, 16, 18, 20 are stepped to define an inwardly depending ledge 26 for supporting marginal portions of a rigid planar circuit board 28, as illustrated in FIG. 1B. A set of cone-tipped corner posts 30, 32, 34, 36 extending upward from the bottom 12 of housing 10 extend through corresponding openings in circuit board 28 for retaining circuit board 28 in the housing 10 during the manufacturing process. The housing 10 also includes a pair of posts 38, 40 extending upward from the upper surface of side wall 20 for retaining an electrical interconnect in the form of a ribbon cable 42, as depicted in FIG. 1B. However, it will be recognized that there are many different ways of retaining the circuit board 28, such as incorporating snap-features built into the housing side walls, and that the cable retaining posts 38, 40 may not be needed in some applications.

Referring to FIG. 1B, the circuit board 28 supports various top-side electrical components 44, such as surface-mount resistors and the like, that are not susceptible to damage from thermal expansion and contraction of potting material. Other components, including those susceptible to damage from potting material, are supported on the bottom or un-exposed face of circuit board 28, as indicated for example by the reference numeral 46 in FIG. 2B. The circuit board 28 is equipped with two different electrical interconnect elements: the aforementioned ribbon cable 42 and a set of terminals 48 housed in plastic connector header 50. The ribbon cable 42 has a number of parallel conductor strips that are individually soldered to various terminals or conductor pads on the exposed face of circuit board 28. The ribbon cable 42 extends upward from the surface of circuit board 28, and the posts 38, 40 of housing 10 are inserted through suitable openings formed in the margins of ribbon cable 42 to provide stress-relief. The terminals 48 may be insert molded in the plastic connector header 50, with the unit being retained on circuit board 28 by solder joints connecting the terminals 48 to conductor pads formed on the hidden face of circuit board 28 as shown in FIG. 2B. The conductor header 50 protrudes out of the housing 10 so that a sufficient portion of the header 50 remains exposed for attachment to a complementary electrical connector when a cover 52 is placed atop the housing 10 as shown in FIG. 1D.

Figure 1C:
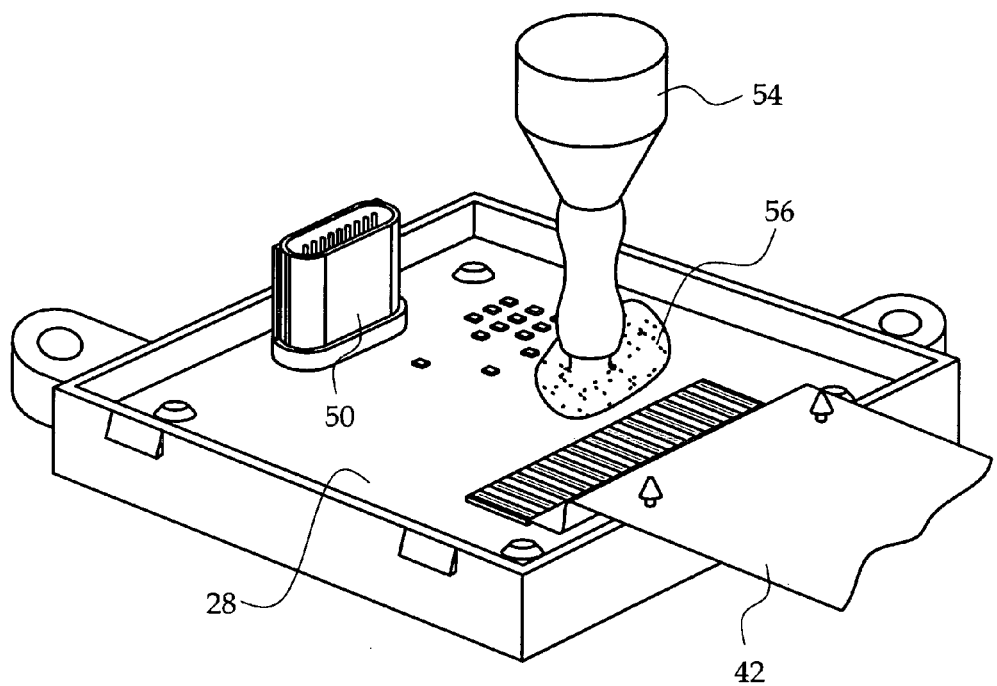

Referring to FIG. 1C, a dispensing nozzle 54 is positioned over the installed circuit board 28, and a predetermined quantity of potting material 56 is dispensed onto the circuit board 28 as shown. The potting material 56 may be any commercially available potting (epoxy, for example) that has an initial free-flowing state, and that chemically cures to a hardened state. The potting material 56 is dispensed in a quantity sufficient to substantially fill the interior volume of housing 10 above the circuit board 28 as seen in FIG. 1D, fully contacting the inner periphery of the side walls 14, 16, 18, 20 and completely surrounding the electrical interconnect elements 42, 50. In the illustrated embodiment, the height of the housing side walls 14, 16, 18, 20 and ledge 26 is such that the potting material 56 completely covers the posts 30, 32, 34, 36, the circuit board components 44, and the terminals and/or solder joints coupling the ribbon cable 42 to the circuit board 28.

Figure 1D:
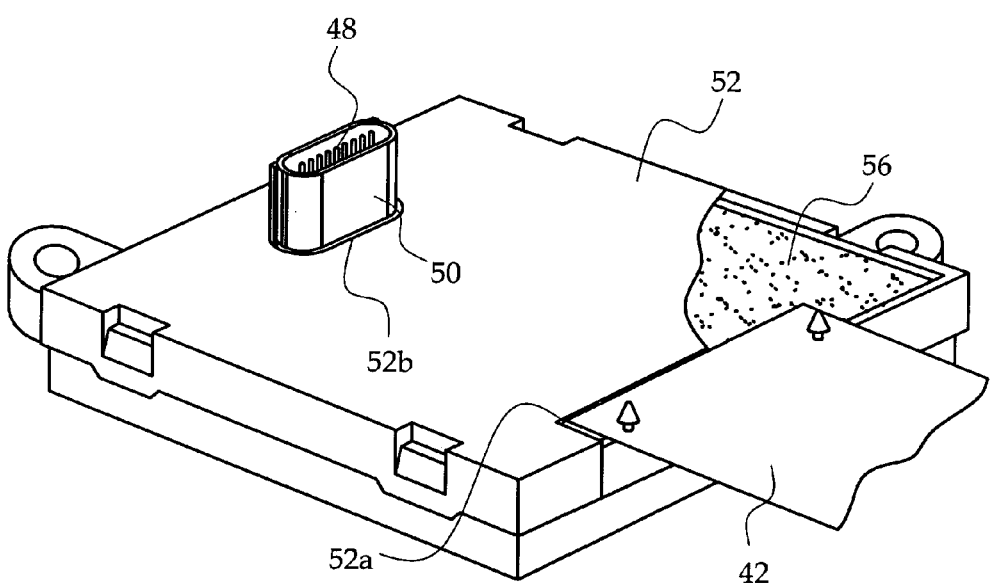

When the potting material 56 cures and hardens, a metal cover 52 having openings 52*a* and 52*b* to accommodate the protruding portions of interconnect elements 42 and 50 is snapped onto the housing 10 as illustrated in FIG. 1D. In applications where the housing is formed of metal, the cover 52 may also be formed of metal to provide shielding from electromagnetic interference. In other applications, the cover 52 may be formed of a different material, or simply omitted.

Referring to FIGS. 2A–2B, it will be seen that connector header 50 and ribbon cable 42 extend upward through the potting material 56 so that they are completely surrounded by the potting material 56. Thus, the potting material 56 not only seals the circuit board 28 to the housing 10; it also provides an environmental seal around connector header 50 and ribbon cable 42. Obviously, the same result can be achieved with other types of electrical interconnects. Only a small amount of potting material is required, which also contributes to low cost and low weight of the completed electronic module.

In summary, the present invention provides a method of manufacturing a sealed electronic module in which potting material dispensed in a single step provides the dual function of sealing a circuit board in the module housing and environmentally sealing around one or more electrical interconnects for the circuit. While the method of the present invention has been described in reference to the illustrated embodiment, it will be recognized that various modifications will occur to those skilled in the art. For example, the housing 10 may be made of plastic or metal, and may have a shape other than rectangular, and so on. Accordingly, it will be understood that manufacturing methods incorporating these and other modifications may fall within the scope of this invention, which is defined by the appended claim.

The invention claimed is:

1. A method of manufacturing a sealed module, comprising the steps of:
    providing a planar circuit board and attaching an electrical interconnect element to a first face of the circuit board;
    providing an open-ended housing having an inwardly depending ledge for supporting marginal portions of said circuit board;
    positioning said housing with its open end facing upward, and inserting said circuit board and attached electrical interconnect element into said housing so that the marginal portions of said circuit board rest on said inwardly depending ledge, the first face of said circuit board is exposed, and said electrical interconnect element protrudes out of said housing;
    dispensing potting material onto the first face of said circuit board in a quantity at least sufficient to cover said first face, surround said electrical interconnect element, and contact an entire inner periphery of said housing; and
    curing said potting material to seal said circuit board in said housing and to form an environmental seal around said electrical interconnect element.

2. The method of claim 1, including the step of:
    attaching a plurality of electrical interconnect elements to the first face of said circuit board, so that said electrical interconnect elements each protrude out of said housing when said circuit board and attached electrical interconnect elements are inserted into said housing and the marginal portions of said circuit board rest on said inwardly depending ledge.

3. The method of claim 1, including the step of:
    attaching a cover to said housing following the dispensing of said potting material, said cover having an opening through which said electrical interconnect element extends.

4. The method of claim 1, wherein said electrical interconnect element is a connector header housing one or more conductive terminals that are electrically coupled to said circuit board.

5. The method of claim 1, wherein said electrical interconnect element is an electrical cable that protrudes out of said housing when the marginal portion of said circuit board is resting on said inwardly depending ledge.

6. The method of claim 5, the method including the steps of:
    providing a strain relief feature on an exterior periphery of said housing; and
    affixing said strain relief feature to a portion of said electrical cable that protrudes out of said housing.

7. The method of claim 5, wherein said electrical cable is a ribbon cable.

* * * * *